(12) United States Patent
Van Noort et al.

(10) Patent No.: US 7,956,399 B2
(45) Date of Patent: Jun. 7, 2011

(54) SEMICONDUCTOR DEVICE WITH LOW BURIED RESISTANCE AND METHOD OF MANUFACTURING SUCH A DEVICE

(75) Inventors: Wibo Daniel Van Noort, Wappinger Falls, NY (US); Jan Sonsky, Leuven (BE); Philippe Meunier-Beillard, Leuven (BE); Erwin Hijzen, Leuven (BE)

(73) Assignee: NXP B.V., Eindhoven (NL)

( * ) Notice: Subject to any disclaimer, the term of this patent is extended or adjusted under 35 U.S.C. 154(b) by 162 days.

(21) Appl. No.: 11/993,296

(22) PCT Filed: Jun. 22, 2006

(86) PCT No.: PCT/IB2006/052027
§ 371 (c)(1),
(2), (4) Date: May 11, 2010

(87) PCT Pub. No.: WO2007/000693
PCT Pub. Date: Jan. 4, 2007

(65) Prior Publication Data
US 2010/0237434 A1    Sep. 23, 2010

(30) Foreign Application Priority Data

Jun. 27, 2005 (EP) ................................... 05105719
Jul. 13, 2005 (EP) ................................... 05106387

(51) Int. Cl.
*H01L 23/485* (2006.01)
(52) U.S. Cl. ................... 257/303; 257/E21.66; 438/444

(58) Field of Classification Search .................. 257/301, 257/303, 309, E27.092, E29.346, E21.66; 438/444
See application file for complete search history.

(56) References Cited

U.S. PATENT DOCUMENTS

2004/0104448 A1* 6/2004 Marty et al. .................. 257/517
2005/0023617 A1* 2/2005 Schoellkopf et al. ......... 257/382

FOREIGN PATENT DOCUMENTS

JP     08148504 A      6/1996
WO    2005013350 A1    2/2005

* cited by examiner

*Primary Examiner* — Thomas L Dickey

(57) ABSTRACT

The invention relates to a semiconductor device (10) with a substrate (11) and a semiconductor body (12) of silicon which comprises an active region (A) with a transistor (T) and a passive region (P) surrounding the active region (A) and which is provided with a buried conducting region (1) of a metallic material that is connected to a conductive region (2) of a metallic material sunken from the surface of the semiconductor body (12), by which the buried conductive region (1) is made electrically connectable at the surface of the semiconductor body (12). According to the invention, the buried conducting region (1) is made at the location of the active region (A) of the semiconductor body (12). In this way, a very low buried resistance can be locally created in the active region (A) in the semiconductor body (12), using a metallic material that has completely different crystallographic properties from the surrounding silicon. This is made possible by using a method according to the invention. Such a buried low resistance offers substantial advantages both for a bipolar transistor and for a MOS transistor.

18 Claims, 8 Drawing Sheets

Figure 1:
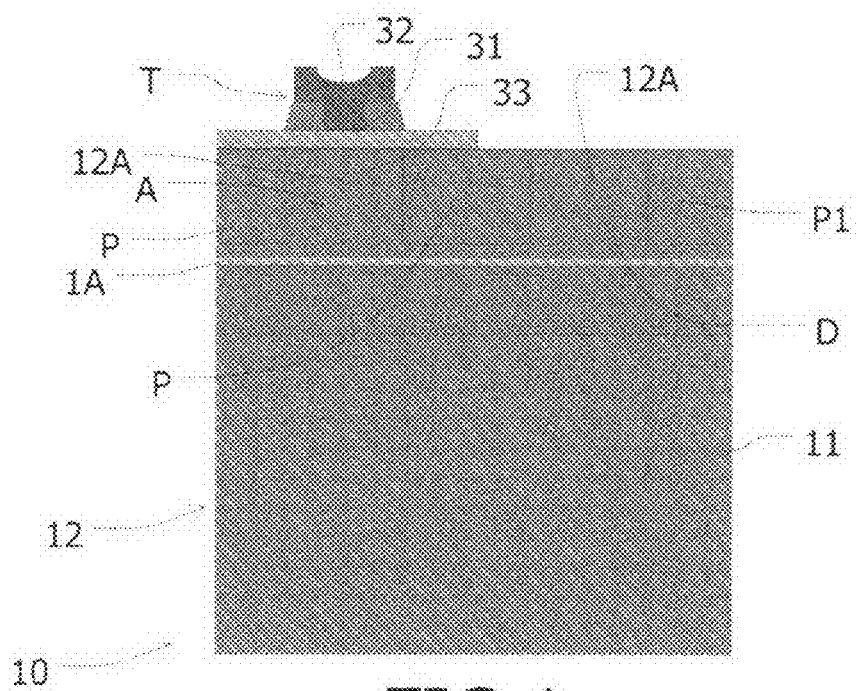
Figure 2:
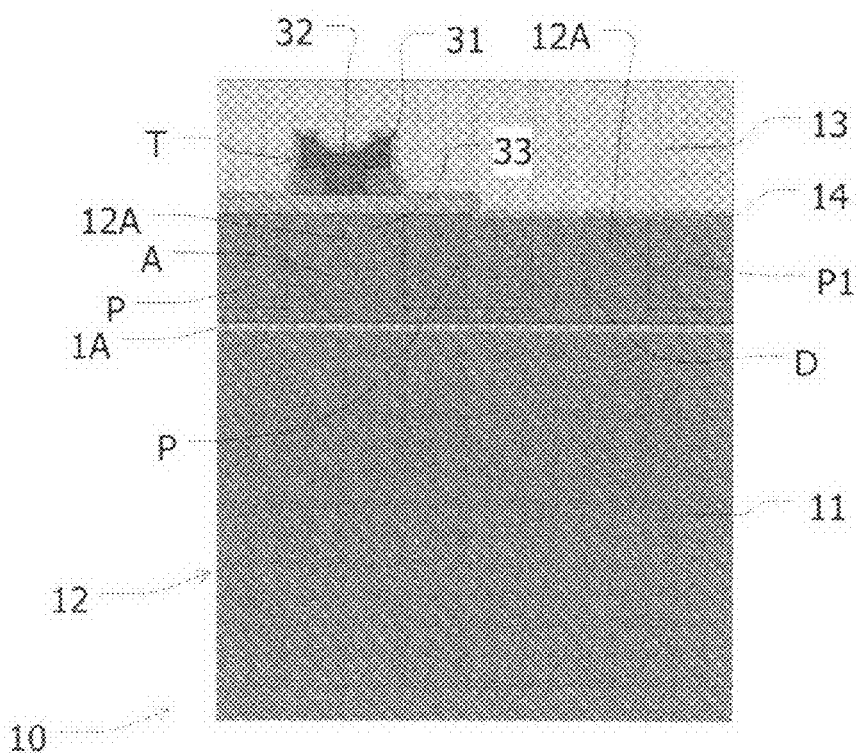
Figure 3:
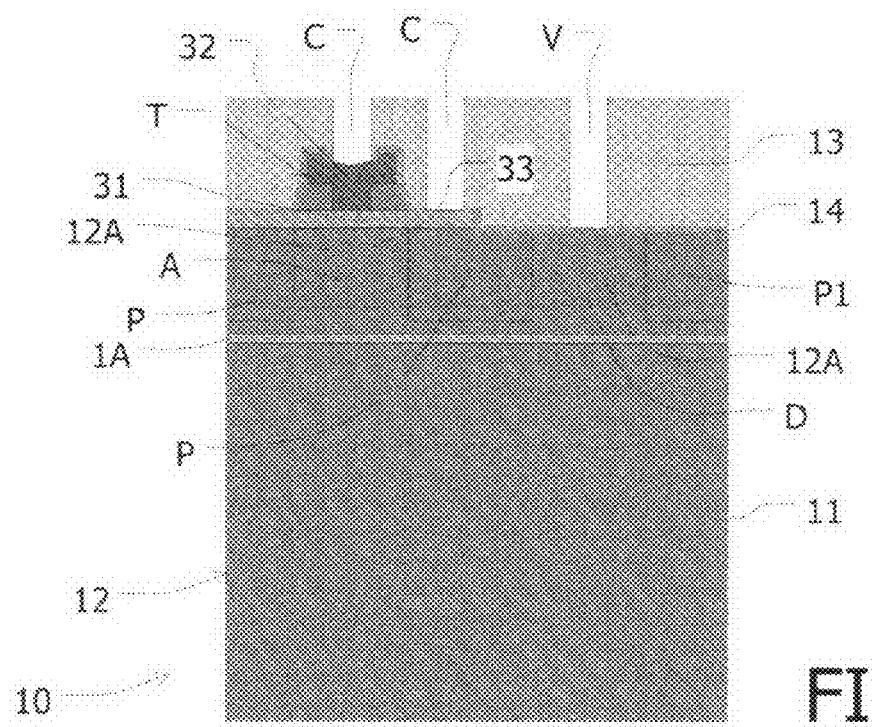
Figure 4:
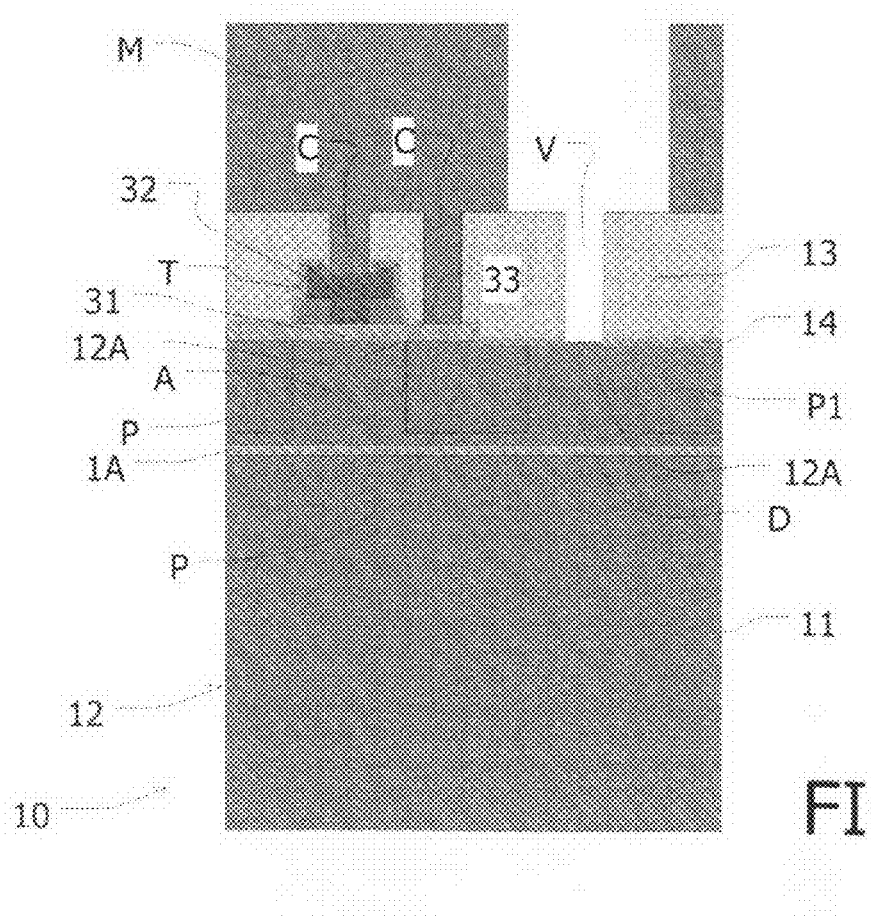
Figure 5:
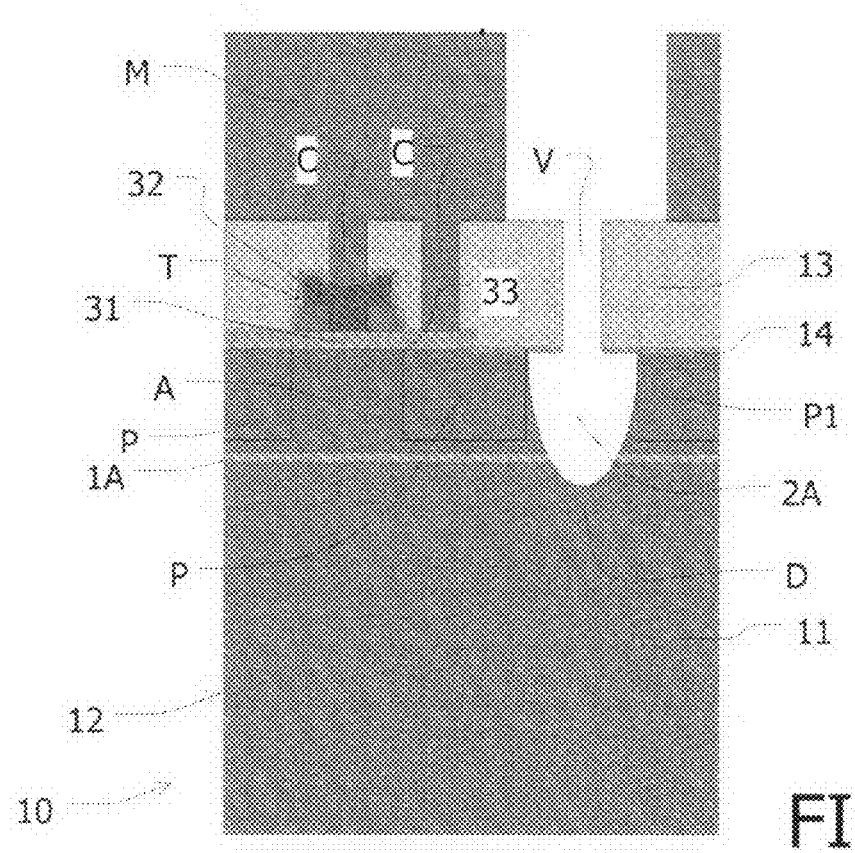
Figure 6:
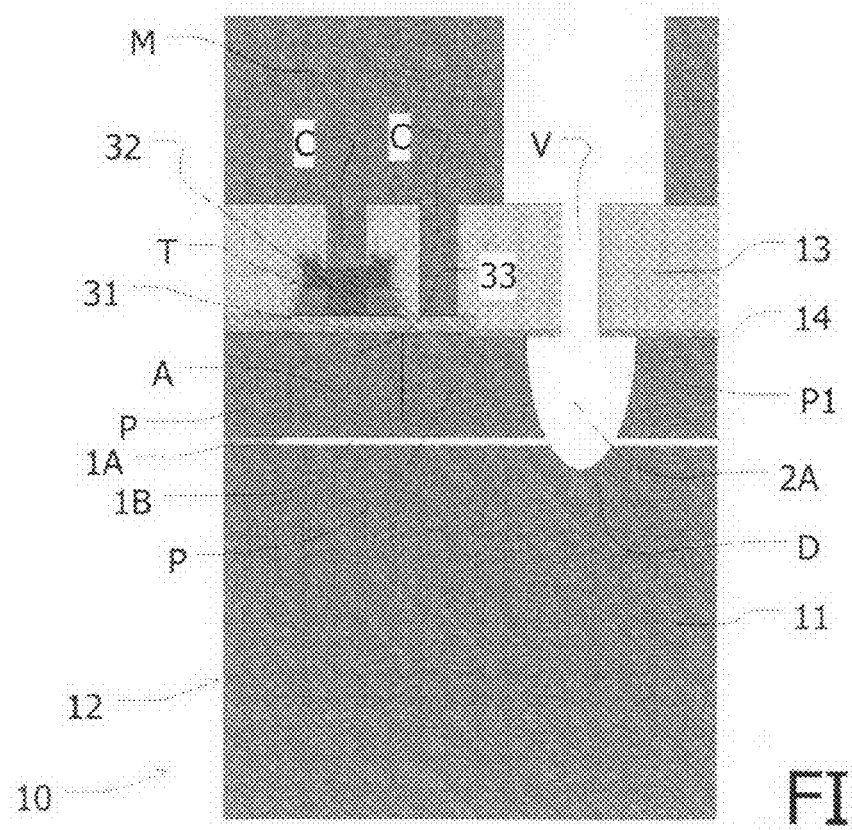

SEMICONDUCTOR DEVICE WITH LOW BURIED RESISTANCE AND METHOD OF MANUFACTURING SUCH A DEVICE

The invention relates to a semiconductor device with a substrate and a semiconductor body of silicon which comprises an active region with a transistor and a passive region surrounding the active region and which is provided with a buried conductive region of a metallic material that is connected to a conductive region of a metallic material sunken from the surface of the semiconductor body. The term metallic material as used herein is understood to mean a material having a specific resistance comparable to that of metal, for example a metal, an alloy or a compound such as copper, aluminum, tungsten, titanium, titanium nitride, etc. The invention also relates to a method of manufacturing such a device.

Such a device and method are known from US patent US 2005/0023617. Said document presents a semiconductor device with a MOS transistor which forms part of a memory and which is formed in the active region of the semiconductor body. The active region is surrounded by a passive region in the form of cavities formed in the semiconductor body, which are filled with an electrically insulating material. Buried within the electrically insulating material is an electrically conductive region of a metallic material, which is connected to a reference voltage and to at least one adjacent element of the memory IC. The electrically conductive region is created by forming an SiGe region in the bottom of a recess covered with an insulator and burying it with a further insulator. After a sunken recess has been formed up to the SiGe region, the SiGe is removed by etching, after which the cavity thus formed is filled with a metallic material.

A drawback of the known transistor is that in the case of a MOS transistor, the transistor exhibits a number of disadvantageous phenomena, among which cross talk.

The object of the invention is therefore to provide a semiconductor device with a transistor that does not exhibit the aforesaid problem and in which the phenomenon of cross talk does not occur, or at least to a smaller extent.

In order to achieve that object, a semiconductor device of the kind referred to in the introduction is characterized in that the buried conductive region is made at the location of the active region of the semiconductor body. The invention is in the first place based on the perception that by burying a highly conductive region under the channel region of a MOS transistor, a significant improvement as regards a number of properties is achieved, among which a reduced sensitivity of the device to cross talk between adjacent transistors. Furthermore, the injection of charge carriers from the part of the semiconductor body that is located under the buried region is prevented, as a result of which the device exhibits an improved behavior at high temperatures and the device is less sensitive to radiation. In addition to that, the invention is based on the perception that such a metallic buried conductive region can be formed within the active region of the semiconductor body whilst avoiding the disadvantageous consequences for the transistor. By forming a SiGe region at the location of the buried conductive region that is to be formed, this region can be removed by selective etching, providing the germanium content is suitably selected, and subsequently be filled with a metallic material. A suitable selection of the thickness and the germanium content of the SiGe region achieves that a monocrystalline part of the silicon semiconductor body is formed above said region through epitaxy, without this region, in which the transistor is formed, exhibiting defects that might have an adverse effect on the transistor properties. This situation is retained when, after formation of the transistor, the SiGe region is etched away and subsequently substituted by a metallic conductive material, whilst—and this is an essential aspect—said metallic conductive area is not monocrystalline or anyway may have a different crystal structure and/or an entirely different lattice constant in comparison with silicon.

On the one hand, the germanium content to be selected depends on the availability of an etchant that is sufficiently selective to silicon. Thus, wet etchants (such as $HNO_3:H_2O$:HF or hydrogen peroxide HF mixtures) and dry etching techniques (for example a plasma with oxygen and fluor containing gases), which all exhibit a sufficiently great selectivity, can be used with a germanium content of approx. 30 at. %. On the other hand, the product of the germanium content and the thickness of the SiGe region must remain below a specified value because otherwise dislocations will result from tensions that have built up in such a region having a grid constant different from that of silicon if a silicon region is formed thereon by epitaxy, which dislocations have an adverse effect on the quality of the silicon region that is formed. With a germanium content of approx. 30 at. %, the thickness of the SiGe region must be less than or equal to approx. 20 nm. If a selective etchant is available, which can also be used with lower germanium contents, the thickness of the SiGe region must be proportionally greater.

In a preferred embodiment, the buried conductive region and the sunken conductive region are filled with the same material as the material of which the connection conductors of the transistor are formed. The advantage of this is that the buried conductive region and the sunken conductive region can be formed at a late stage of the manufacture of the device. At such a late stage, an insulating layer that is present at that stage, the so-termed pre-metal dielectric, gives the device sufficient strength and cohesion in order that the cavities of the sunken recess and the buried region can be formed without any problems. The connection conductors of the transistor are formed simultaneously with the filling of the buried region and the sunken recess in that case.

In an advantageous variant, the buried conductive region is spaced from the surface of the semiconductor region by a distance smaller than the thickness of the passive region. The effect of the buried conductive region is optimal in that case. Preferably, a part of the semiconductor body in which the sunken conductive region is formed is located between the passive region and the active region in that case.

In another variant, the buried conductive region is formed in a part of the semiconductor body that is located outside the passive region. In that case the SiGe region must extend below the passive region into the aforesaid part of the semiconductor body. To reduce the distance from the buried conductive region to the surface of the semiconductor body in that case, a further SiGe region may be provided, which region is formed above the aforesaid SiGe region, being separated therefrom by a silicon region. After removal of (a part of) the SiGe region, the overlying silicon portion of the semiconductor body can be removed by selective etching, with said further SiGe region, which is spaced from the surface by a distance smaller than the thickness of the passive region, functioning as an etch stop, like the passive region itself. Another advantage of this variant is that the buried conductive region may have a thickness greater than that of the SiGe region. Furthermore, said region will be easier to form, because the available cavity will be larger.

Preferably, the passive region comprises a so-termed trench isolation region. If the transistor is a MOS transistor, the buried conductive region will be located in the channel region of the transistor, as already noted before.

Furthermore, the device according to the invention may advantageously comprise a bipolar transistor. The buried conductive region will advantageously form part of the collector thereof in that case. As a result, said transistor will have a very low collector series resistance, and the dimensions of the transistor can be strongly reduced without any difficulty, whilst nevertheless an excellent high frequency behavior is obtained. After all, reduction of the dimension of the collector layer to a thickness of less than 100 nm will result in an increased base collector capacitance. On account of the very low series resistance of a metallic region, the product of resistance and capacitance in such a device will remain sufficiently low so that a very high operating frequency can be achieved.

A method of manufacturing a semiconductor device with a substrate and a semiconductor body of silicon which comprises an active region with a transistor and a passive region surrounding the active region and which is provided with a buried conductive region of a metallic material that is connected to a conductive region of a metallic material sunken from the surface of the semiconductor body, with the buried conductive region being formed by means of an SiGe region, is according to the invention characterized by the following steps:

forming the semiconductor body by forming a monocrystalline SiGe region on a silicon portion thereof, within the active region of the semiconductor body, forming a further silicon portion of the semiconductor body by epitaxy on the semiconductor body, forming an open sunken region from the surface to the SiGe region, forming a cavity at the location of the SiGe region by selective etching of the SiGe region, and filling said cavity with the metallic material, thereby forming the buried conductive region at that location.

Using such a method, a device according to the invention can be obtained without any difficulty.

In a preferred embodiment, the open sunken region is filled with a metallic material, thus forming the sunken conductive region. Preferably, the same metallic material is used as for forming the buried conductive region. Preferably, the passive region is formed by forming trench isolation regions. In one variant, the sunken conductive region is formed outside the passive region.

In an advantageous embodiment, the open sunken region is formed after the transistor has been formed and after an insulating layer has been deposited on the semiconductor body, which insulating layer is provided with contact openings for the transistor and with a further opening at the location of the open sunken region to be formed, after the contact openings have been covered with a mask.

In another variant, a further SiGe region is formed on said further silicon portion of the semiconductor body, on which further region another silicon portion of the semiconductor body is formed, with the SiGe region and said further SiGe region being spaced from the surface of the semiconductor body by a distance larger and smaller, respectively, than the thickness of the passive region. In this variant, the cavity is preferably enlarged up to said further SiGe region after formation of the cavity by etching away adjacent silicon.

Figure 7:
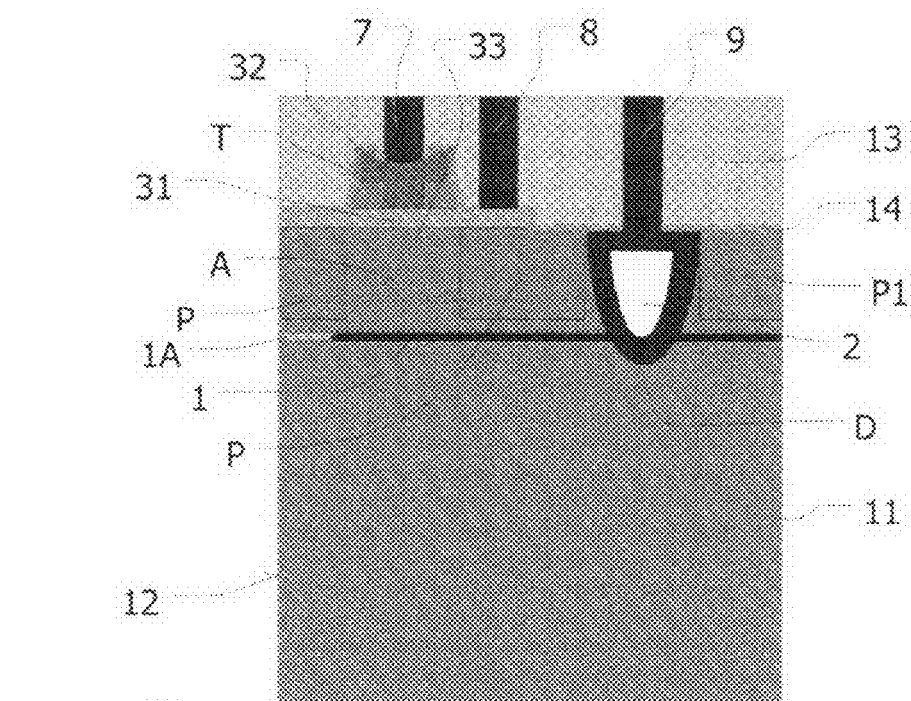
Figure 8:
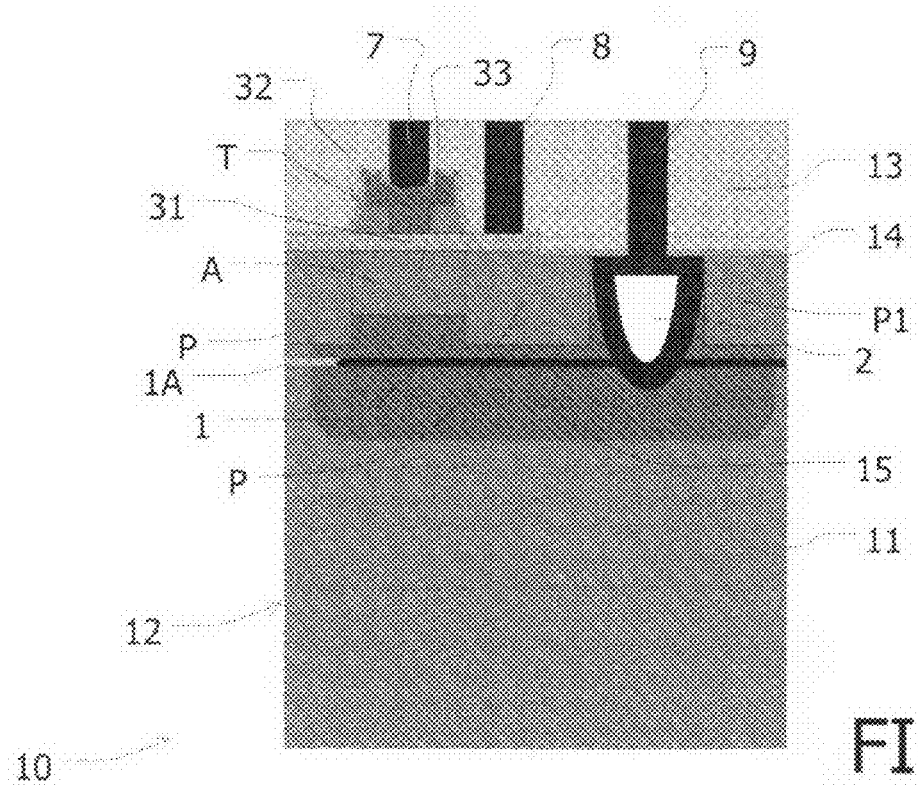
Figure 9:
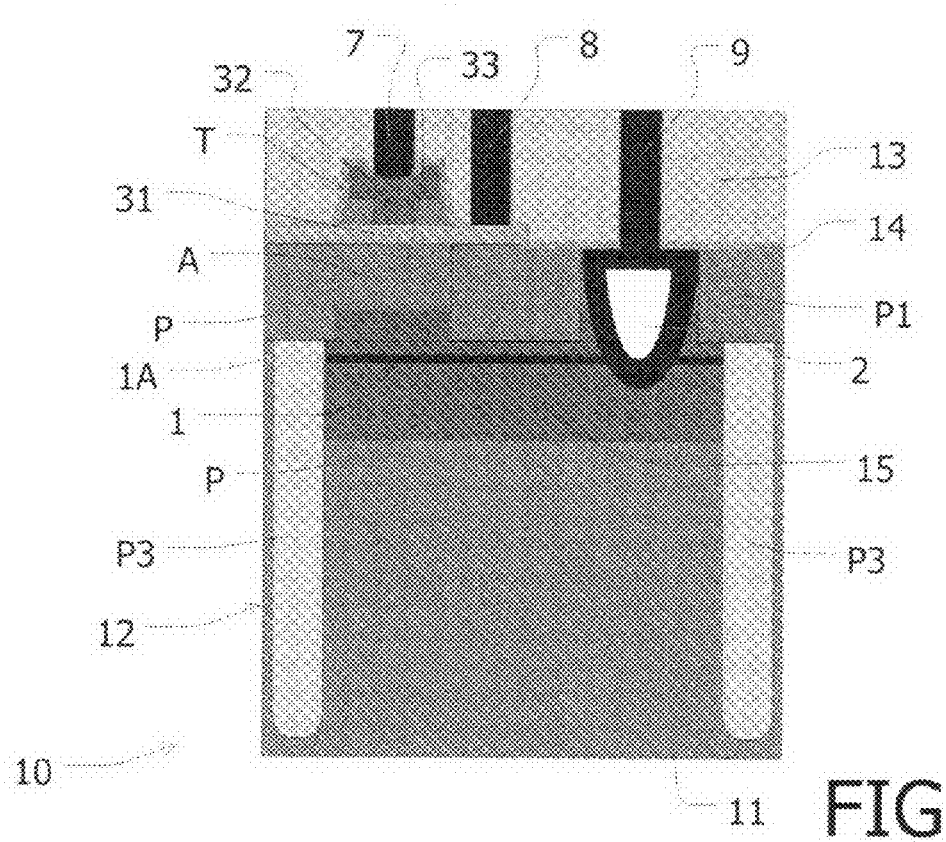
Figure 10:
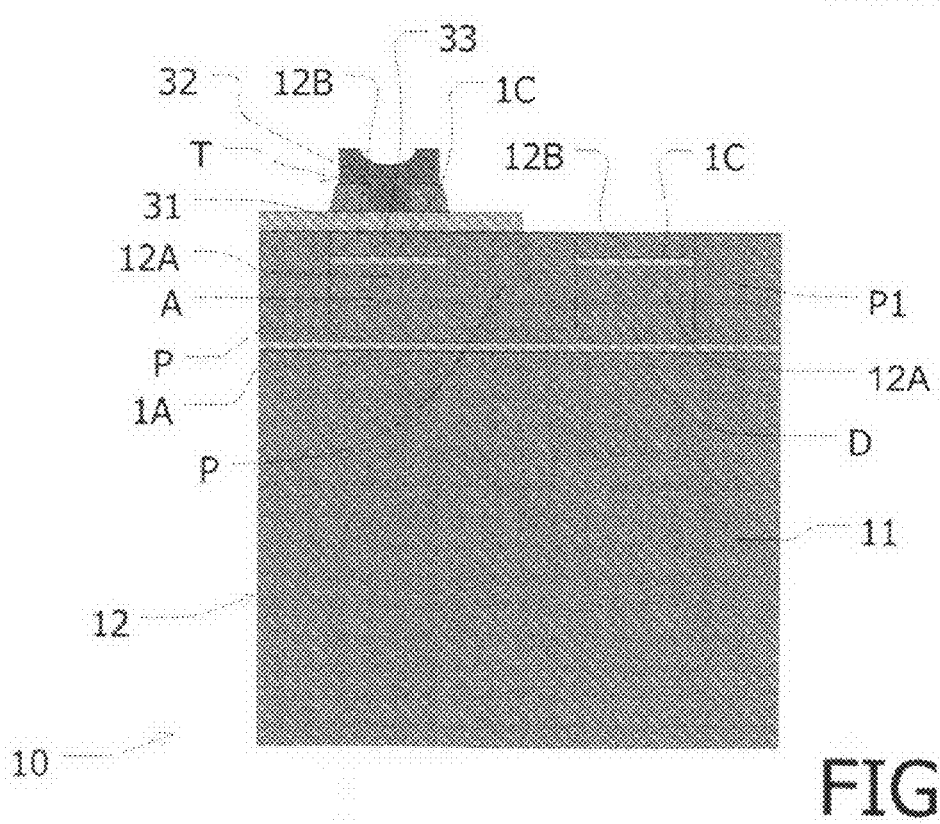
Figure 11:
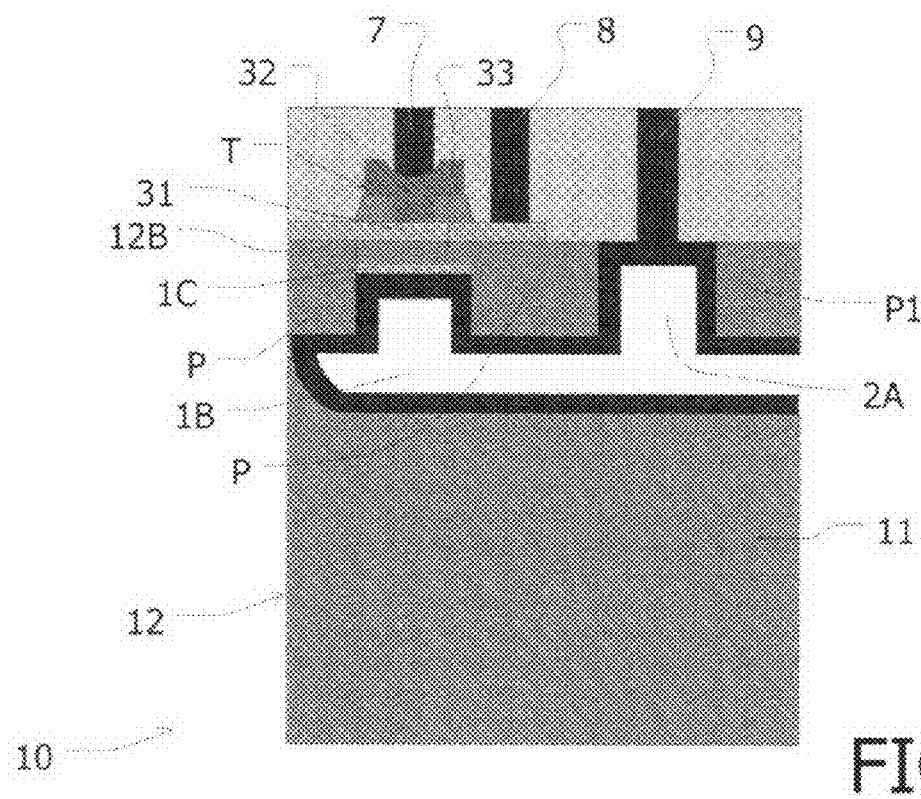
Figure 12:
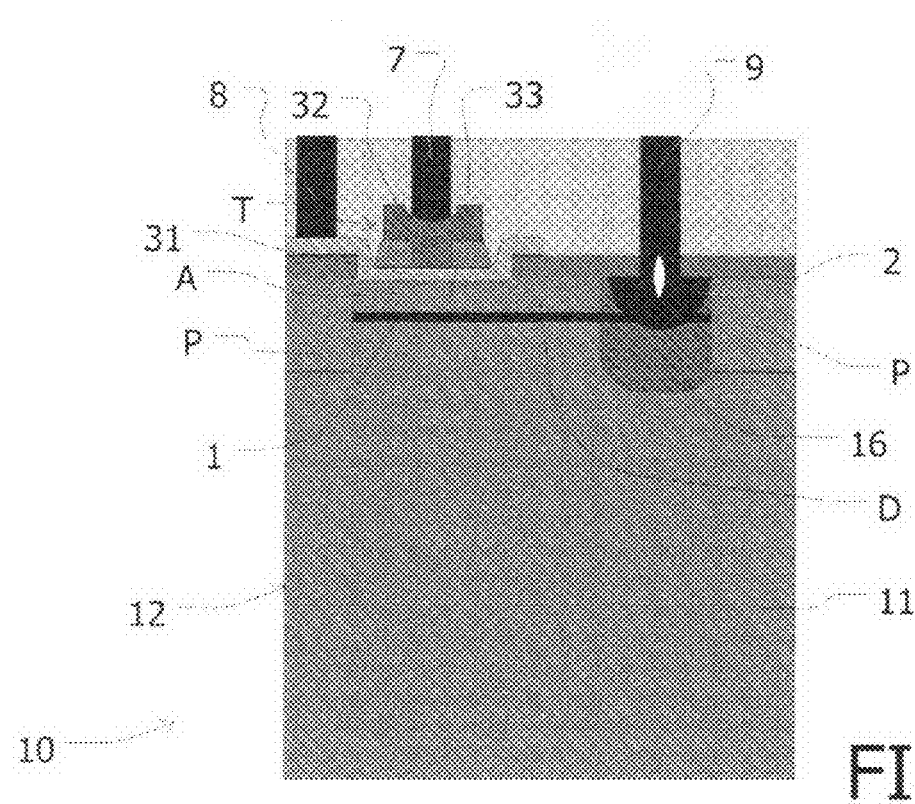
Figure 13:
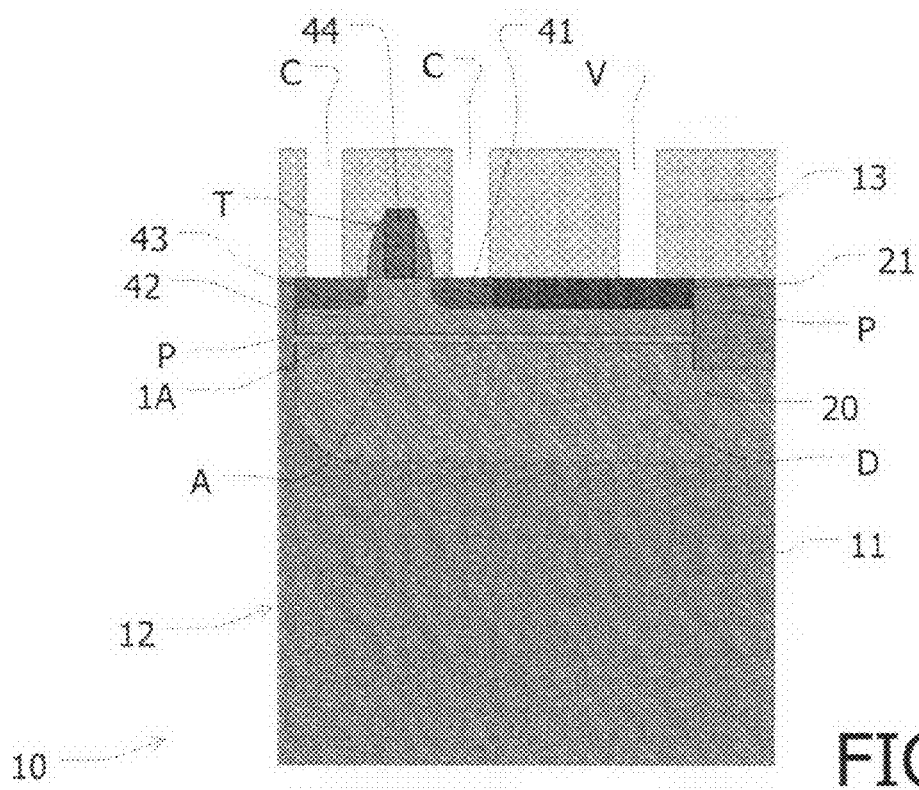
Figure 14:
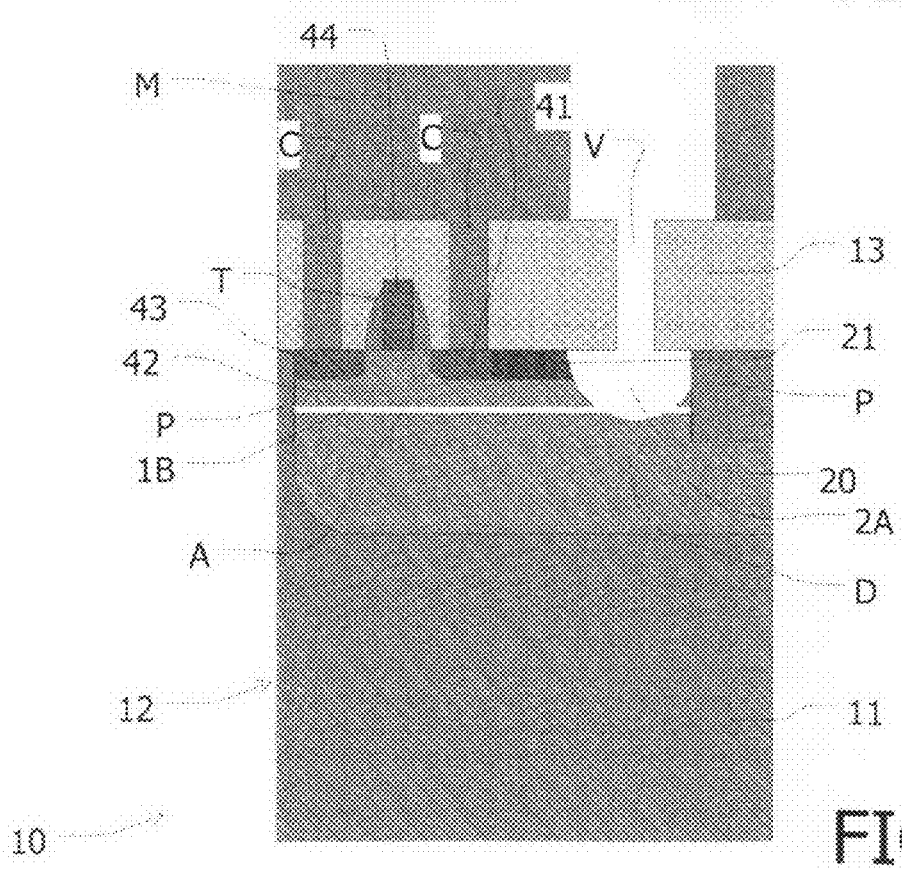
Figure 15:
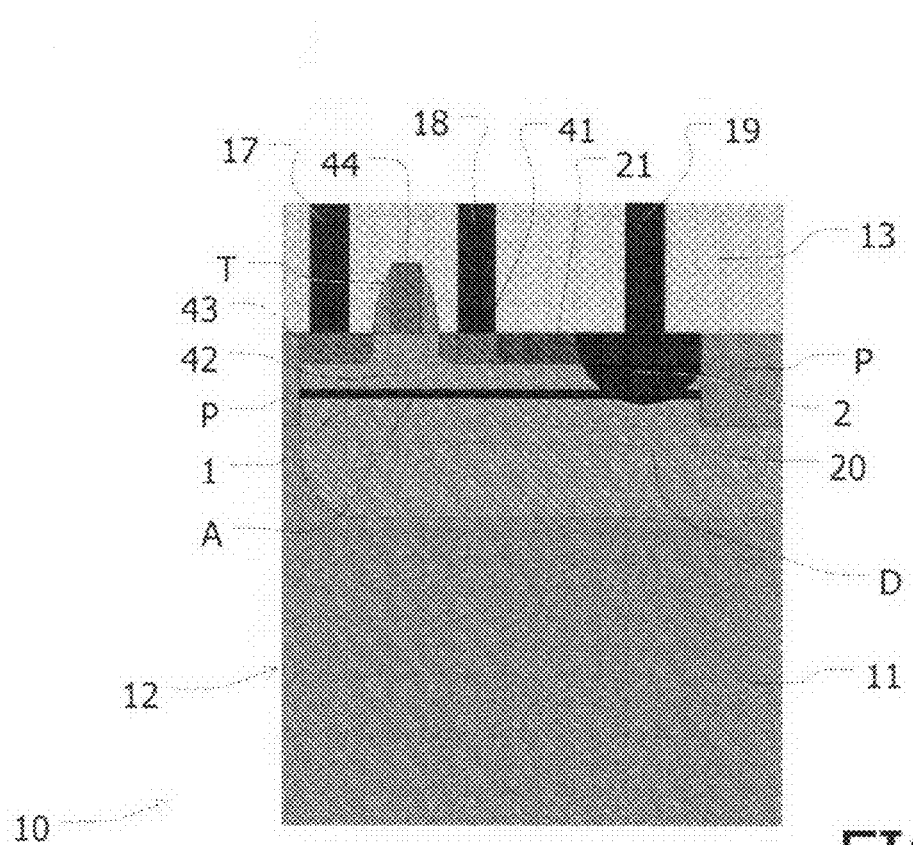
Figure 16:
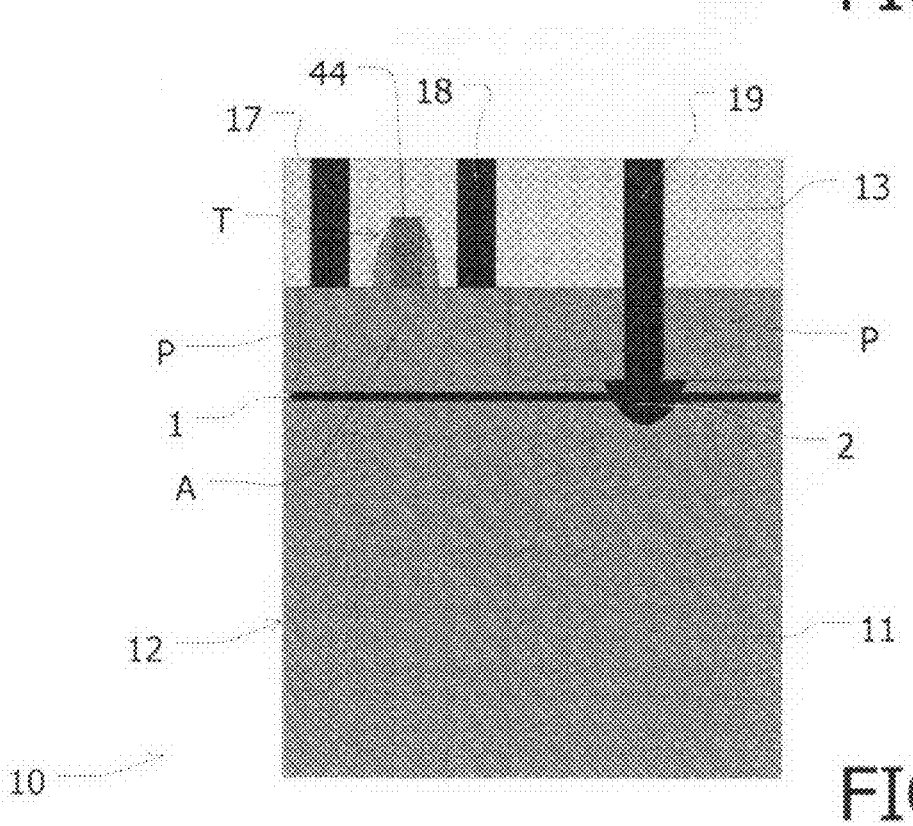

The invention will now be explained in more detail with reference to an embodiment and the drawing, in which:

FIGS. 1-7 are schematic, cross-sectional views perpendicular to the thickness direction of a first example of a device according to the invention, showing successive stages of the manufacture thereof by means of a method according to the invention, FIGS. 8 and 9 are schematic, cross-sectional views perpendicular to the thickness direction of two variants of the device according to the first example, FIGS. 10 and 11 are schematic, cross-sectional views perpendicular to the thickness direction of a second example of a device according to the invention, showing relevant stages of the manufacture thereof by means of a method according to the invention, FIG. 12 is a schematic, cross-sectional view perpendicular to the thickness direction of a variant of the device according to the second example, FIGS. 13-15 are schematic, cross-sectional views perpendicular to the thickness direction of a third example of a device according to the invention, showing relevant stages of the manufacture thereof by means of a method according to the invention, and FIG. 16 is a schematic, cross-sectional view perpendicular to the thickness direction of a device according to the invention.

The Figures are not drawn to scale, and some dimensions are exaggerated for the sake of clarity. Like regions or parts are indicated by the same numerals as much as possible.

FIGS. 1-7 are schematic cross-sectional views perpendicular to the thickness direction of a first example of a device according to the invention, showing successive stages of the manufacture thereof by means of a method according to the invention. The—substantially complete—device 10 of this example (see FIG. 7) comprises a semiconductor body 12 of silicon, comprising a p-type silicon substrate 11 with a semiconductor layer structure provided thereon and a bipolar transistor T. The transistor T, a discrete transistor in this example, is a differential or epitaxial type transistor, i.e. a base region 31 comprises a layered region grown on the semiconductor body which is polycrystalline above a passive region P and which is monocrystalline within an active region A comprising a collector region 33 of the transistor. Present above said region is an emitter region 32, which is T-shaped in this example. Connection conductors 7, 8 located within an electrically insulating layer 13 provide the electrical connection of the emitter region 32 and the base region 31. The base region 31 contains a mixed crystal of silicon and germanium having a germanium content of 20 at. % in view of the high frequency nature of the transistor of this example. Present on the transistor and under the insulating layer 13 is a further electrically insulating layer 14.

Located in the active region A is a buried conductive region 1, which comprises a metallic conductor and which forms part of the collector region 33 of the transistor T in this example. The buried conductive region 1 is connected at the surface to a connection conductor 9 for the collector region 33 via a conductive region 2 sunken from the surface, which is filled with a metallic conductive material. In this example both the regions 1, 2 and the connection conductors 7, 8, 9 are formed of the same material, which material comprises tungsten in this example. As FIG. 7 shows, the device 10 still comprises a part of a SiGe region 1A that has been used in forming the buried conductive region 1. The sunken conductive region 2 has been formed in a part D of the semiconductor body 12 which is located outside the passive region P and which is in turn adjacent to a further passive region P1.

Conventional values have been selected for the dimensions of the device 10 and the doping concentrations and the dimensions of the (semiconductor) regions forming part thereof.

The device 10 of this embodiment, for example, is manufactured as follows by means of a method according to the invention.

The starting point (see FIG. 1) is a p-type silicon substrate 11, which forms part of a semiconductor body 12 and on which an SiGe layer 1A, for example having a thickness of 20 nm and a germanium content of 30 at. %, is deposited by epitaxy. On said layer a further silicon part 12A of the semiconductor body 12 is deposited, likewise by epitaxy. Said part 12A is of the n-conductivity type, it forms a lower-doped part of the collector region 33 of the transistor T, at least within the active region A. Passive regions P, P1 in the form of so-termed trench isolation regions are formed in the surface. In/within the active region A of the semiconductor body 12 a bipolar transistor T is formed, in this case a transistor of the so-termed differential or epitaxial type. The contacting steps that are used for this purpose are conventional steps and will not be separately discussed herein.

Subsequently, electrically insulating layers 13, 40 are formed on the structure (see FIG. 2) as discussed above. In said layers 13, 14 (see FIG. 3), contact openings C and a further opening V, in this case also a contact opening of the transistor T, are formed by means of photolithography and etching.

Then (see FIG. 4) the contact openings C are covered with a photoresist mask M. The further opening V remains accessible, and via said opening V (see FIG. 5) a sunken open region 2A is formed in the semiconductor body 12 between the passive region P and a further passive region P1 by etching, in this case by means of a dry etching process up to the SiGe layer 1A.

Then (see FIG. 6) a cavity 1B is formed in the SiGe layer 1A by etching, using a selective dry etching step with atomic fluorine, which cavity 1B extends into the active region A of the semiconductor body 12.

Following this (see FIG. 7) the mask M is removed and the contact openings C, the further opening V and the buried open region 1B as well as the sunken open region 2A are filled with a metallic material, which material comprises tungsten in this example, which is applied by means of the CVD (=Chemical Vapour Deposition) technique. At the same time, the connection conductors 7, 8, 9 and the buried conductive region 1 and the sunken conductive region 2 are formed. The latter region 2 may be filled completely or—as is shown in the drawing—still comprise a cavity. The only thing that is essential, of course, is that the sunken conductive region 2 forms a perfect electrically conductive connection between the buried conductive region 1 which, in this example, forms part of the collector region 33 of the bipolar npn (in this example) transistor T and the connection conductor 9 in question.

Individual devices 10 ready for final assembly are subsequently obtained after formation of one or more metallization layers (interconnects), followed, after passivation, by a separation process, such as sawing.

FIGS. 8 and 9 are schematic, cross-sectional views perpendicular to the thickness direction of two variants of the device 10 of the first example.

In the first variant (see FIG. 8) the buried conductive region 1 is located within a buried highly doped semiconductor region 15. Such a region, in this case of n+ silicon, is known per se and commonly used in a bipolar transistor, and in this case, too, it is formed in a usual manner, for example by local implantation, whether or not prior to the epitaxy process by which the SiGe layer 1A and the overlying part 12A of the semiconductor body 12 have been formed.

In the second variant (see FIG. 9), which is otherwise identical to the first variant, further passive regions P3 are present under the passive regions P, as a result of which a so-termed deep trench insulation is formed.

FIGS. 10 and 11 are schematic, cross-sectional views perpendicular to the thickness direction of a second example of a device according to the invention, showing relevant stages of the manufacture thereof by means of a method according to the invention. The device 10 and the manufacture thereof are for the greater part identical to those of the first example, and consequently only the differences will be discussed herein.

A first difference (see FIG. 10) concerns the formation of a further SiGe region 1C on top of the silicon part 12A of the semiconductor body 12 and of another silicon region 12B on said further SiGe region 1C of the semiconductor body 12, prior to the formation of the passive regions P, P1. This can only be done directly after the formation of the regions 1A, 12A and in the same epitaxy process. Said further SiGe region 1C is now spaced from the surface by a distance that is smaller than the thickness of the passive region P, however, whilst the SiGe region/layer 1A continues under the passive region P, as in the first example.

A second difference (see FIG. 11) can be distinguished upon formation of the open the sunken region 2A and the cavity 1B at the location of a part of the SiGe layer 1A. When the sunken open region 2A is being formed, the part of the further SiGe region 1C that is present at that location is removed, which may or may not be done by means of a selective etching process/etchant. The cavity 1B at the location of the buried conductive region 1 is formed in two steps. In a first step, (part of) the SiGe region 1A is removed by means of a selective etching process. In a second step, selective etching of the silicon of the semiconductor body 12 takes place. As a result, the cavity 1B is enlarged in all directions, with the further SiGe region 1C functioning as an etch stop layer in the active region A of the semiconductor body 12. If desired, said further SiGe region 1C can then be removed by means of a selective etching step. An important advantage of this example is that the dimensions of the buried conductive region—and of the sunken conductive region—are relatively large, which facilitates the forming of the cavity and leads to a reduced resistance. In addition to that it is an advantage that the buried conductive region 1 within the passive region P can be positioned at a very small distance from the surface of the semiconductor body 12. In the case of a bipolar transistor T, this contributes significantly to a high operating frequency, also because very aggressive downscaling of the dimension of the collector region 33 is possible in this way.

FIG. 12 is a schematic, cross-sectional view perpendicular to the thickness direction of a variant of the device according to the second example. In this example, a part D of the semiconductor body 12 is located between the active region A thereof and the passive region P. The sunken conductive region has thus been formed within the part of the semiconductor 12 that is bounded by the passive regions P, and consequently the spacing between the buried conductive region 1 that has been formed and the surface of the semiconductor 12 can be (significantly) smaller than the thickness of the passive region P in this variant as well. This variant furthermore comprises an optional sunken, highly doped semiconductor region 16 surrounding the sunken conductive region 2.

FIGS. 13-15 are schematic, cross-sectional views perpendicular to the thickness direction of a third example of a device according to the invention, showing relevant stages of the manufacture thereof by means of a method according to the invention. A first important difference (see FIG. 15) with the previous examples is that the transistor T now comprises a MOS transistor, which has been formed in an n-well 20 in the p-type substrate 11. As in the variant to the second example that has been discussed above, the buried conductive region 1 is now spaced from the surface by a short distance, and the sunken conductive region 2 is positioned within a part D of the semiconductor body 12 between the active region A and the passive region P. The sunken conductive region 2, and thus the buried conductive region 1, are in electrically conductive contact with the substrate 1 via a highly doped semiconductor region 21, which is connected to the drain region 41 of the transistor T. The connection conductor 19 now forms a connection of a conductor that extends into the channel region 42 of the MOST (in this case a NMOST). The connection conductors 17, 18 form the electrical connections of the source region 43 and the drain region 41 of the NMOST. The electrical conduction of the gate electrode 44 of the MOS transistor is not shown in the sectional view of FIG. 15. The manufacture of the device of this example is not essentially different from the manufacture of the device according to the preceding examples.

An essential difference (see FIG. 13) is of course the fact that the transistor T now comprises a MOS transistor, which has a usual structure and which is manufactured in a usual manner, to be true, but whose manufacture is not different (leaving aside details) from the manufacture of the bipolar transistor of the first example. An important difference in the first steps of the manufacture of the device 10 of this example is the formation of a so-termed n-well 20 in the p-type substrate 11, as is usual in particular in CMOS processes. After the formation of the transistor, an insulating layer 13 is provided again, in which openings C,V are formed.

The formation of the open sunken region 2A and the cavity 1B (see FIG. 14) takes place in the same manner as in the first example, with this difference that—as already noted before—formation of these regions takes place within a part D of the semiconductor body 12 between the active region A and the passive region P thereof.

After the formation of the buried conductive region 1 and the sunken conductive region 2 as well as the connection conductors 17, 18, 19 (see FIG. 315), individual devices 10 that are ready for final assembly can be obtained again after the formation of one or more metallization layers (interconnect), followed by a separation process, such as sawing, after passivation.

FIG. 16 is a schematic, cross-sectional view perpendicular to the thickness direction of a variant of the device of the third example. The main difference is that the sunken conductive region 2 is formed through a passive region P, under said passive region P.

The advantage of this is that this makes it possible to reduce the lateral dimensions.

The invention is not limited to the embodiments as discussed herein, as many variations and modifications are possible to those skilled in the art within the scope of the invention. Thus, in addition to being suitable for use in a discrete semiconductor device, the invention is also very suitable for use in an integrated semiconductor device, such as a (BI) CMOS (=(Bipolar) Complementary Metal Oxide Semiconductor) IC (=Integrated Circuit). In the case of a BICMOS IC, both the MOS transistors and the bipolar transistors may advantageously be transistors according to the invention. Furthermore it is noted that instead of using trench isolation regions it is also possible to use isolation regions that have been obtained by means of the LOCOS (=Local Oxidation Of Silicon) technique.

Another modification concerns the nature of the contact between the buried conductive region and the overlying part of the semiconductor body. Depending on the doping of the latter part and on the selection of the metallic material, said contact may be an ohmic contact, a MIS (=Metal Insulator Semiconductor), or a Schottky contact. In that connection it is clear that the connection conductors need not necessarily be of the same material as the sunken conductive region.

Many variants and modifications are possible also with regard to a method according to the invention. Thus, the buried conductive region may be formed as in the examples by removing part of a uniform SiGe epitaxial layer by etching. Another possibility is the use of really localized and defined SiGe regions. Said regions can be formed by removing parts of an SiGe layer that has been formed, after which a silicon portion of the semiconductor body is formed on the remaining parts. Furthermore, advantageous use can be made of a selective epitaxial deposition process for forming such an SiGe region.

The invention claimed is:

1. A semiconductor device with a substrate and a semiconductor body of silicon which comprises an active region with a transistor and a passive region surrounding the active region and which is provided with a buried conducting region of a metallic material that is connected to a conductive region of a metallic material sunken from the surface of the semiconductor body, characterized in that the buried conductive region is made at least at the location of the active region of the semiconductor body, characterized in that the buried conductive region and the sunken conductive region are filled with the same material as the material of which connection conductors of the transistor are formed.

2. A semiconductor device as claimed in claim 1, characterized in that the buried conductive region is spaced from the surface of the semiconductor body by a distance smaller than the thickness of the passive region.

3. A semiconductor device as claimed in claim 1, characterized in that a part of the semiconductor body is located between the passive region and the active region and in that the sunken conductive region is formed in said part.

4. A semiconductor device as claimed in claim 1, characterized in that the buried conductive region is formed in a part of the semiconductor body that is located outside the passive region.

5. A semiconductor device as claimed in claim 1, characterized in that the passive region comprises a so-termed trench isolation region.

6. A semiconductor device as claimed in claim 1, characterized in that the transistor comprises a bipolar transistor and in that it is provided with a collector region in which the buried conductive region is located.

7. A semiconductor device as claimed in claim 1, characterized in that the transistor comprises a MOS transistor provided with a channel region in which the buried conductive region is located.

8. A method of manufacturing a semiconductor device with a substrate and a semiconductor body of silicon which comprises an active region with a transistor and a passive region surrounding the active region, wherein a buried conductive region of a metallic material is formed, which region is connected to a conductive region of a metallic material sunken from the surface of the semiconductor body, and wherein the buried conductive region is formed by means of a SiGe region, wherein the method is characterized by the following steps:

forming the semiconductor body by forming a monocrystalline SiGe region on a silicon portion thereof, within the active region of the semiconductor body, forming a further silicon portion of the semiconductor body by epitaxy on the semiconductor body, forming an open sunken region from the surface to the SiGe region, forming a cavity at the location of the SiGe region by selective etching of the SiGe region, and filling said cavity with the metallic material, thereby forming the buried conductive region at that location, characterized in that a further SiGe region is formed on said further silicon portion of the semiconductor body, on which further region another silicon portion of the semiconductor body is formed, wherein said SiGe region and said further SiGe region are spaced from the surface of the semiconductor body by a distance larger and smaller, respectively, than the thickness of the passive region, characterized in that the cavity is enlarged up to said further SiGe region after formation of the cavity by etching away adjacent silicon.

9. A method as claimed in claim 8, characterized in that the open sunken region is filled with a metallic material so as to form the sunken conductive region.

10. A method as claimed in claim 8, characterized in that the passive region is formed by forming trench isolation regions.

11. A method as claimed in claim 10, characterized in that the sunken conductive region is formed outside the passive region.

12. A method as claimed in claim 8, characterized in that the open sunken region is formed after the transistor has been formed and after an insulating layer has been deposited on the semiconductor body, which insulating layer is provided with contact openings for the transistor and with a further opening at the location of the open sunken region to be formed, after the contact openings have been covered with a mask.

13. A semiconductor device with a substrate and a semiconductor body of silicon which comprises an active region with a transistor and a passive region surrounding the active region and which is provided with a buried conducting region of a metallic material that is connected to a conductive region of a metallic material sunken from the surface of the semiconductor body, characterized in that the buried conductive region is made at least at the location of the active region of the semiconductor body, characterized in that the transistor comprises a bipolar transistor and in that it is provided with a collector region in which the buried conductive region is located.

14. A semiconductor device as claimed in claim 13, characterized in that the buried conductive region and the sunken conductive region are filled with the same material as the material of which connection conductors of the transistor are formed.

15. A semiconductor device as claimed in claim 13, characterized in that the buried conductive region is spaced from the surface of the semiconductor body by a distance smaller than the thickness of the passive region.

16. A semiconductor device as claimed in claim 13, characterized in that a part of the semiconductor body is located between the passive region and the active region and in that the sunken conductive region is formed in said part.

17. A semiconductor device as claimed in claim 13, characterized in that the buried conductive region is formed in a part of the semiconductor body that is located outside the passive region.

18. A semiconductor device as claimed in claim 13, characterized in that the passive region comprises a so-termed trench isolation region.

* * * * *